US 6,621,261 B2

(12) United States Patent
Tsuchiya

(10) Patent No.: US 6,621,261 B2
(45) Date of Patent: Sep. 16, 2003

(54) WORK INSPECTION APPARATUS

(75) Inventor: Masamichi Tsuchiya, Tokyo-To (JP)

(73) Assignee: Tokyo Weld Co., Ltd., Tokyo (JP)

( * ) Notice: Subject to any disclaimer, the term of this patent is extended or adjusted under 35 U.S.C. 154(b) by 60 days.

(21) Appl. No.: 09/908,800

(22) Filed: Jul. 20, 2001

(65) Prior Publication Data

US 2002/0030479 A1 Mar. 14, 2002

(30) Foreign Application Priority Data

Jul. 21, 2000 (JP) .................................. 2000-220997

(51) Int. Cl.[7] .............................................. G01R 31/02
(52) U.S. Cl. ...................... 324/158.1; 324/754; 324/757
(58) Field of Search ............................. 324/158.1, 757, 324/754; 200/253; 15/1; 134/6

(56) References Cited

U.S. PATENT DOCUMENTS 2,741,683 A * 4/1956 Persons ....................... 200/253
3,628,144 A * 12/1971 Aronstein et al. .......... 324/757

FOREIGN PATENT DOCUMENTS

| JP | 10-209232 | 7/1998 |
|----|-----------|--------|
| JP | 2000-40717 | 8/2000 |
| JP | 2001-13163 | 1/2001 |
| JP | 2000-338152 | 8/2001 |

* cited by examiner

Primary Examiner—Ernest Karlsen
(74) Attorney, Agent, or Firm—Birch, Stewart, Kolasch & Birch, LLP

(57) ABSTRACT

A work inspection apparatus 10 includes a base 20, and a rotating turntable 11 arranged on the base 20 horizontally and provided with plural work holding pockets 12 on its periphery. A measuring electrode 13 is provided on the base 20, which is brought in contact with works W held in the work holding pockets 12 for inspecting their electric characteristics. Each of the work holding pockets 12 of the turntable 11 is opened outward. A polishing member 14 is mounted in at least one of the work holding pockets 12 of the turntable 11 for polishing the measuring electrode 13.

3 Claims, 1 Drawing Sheet

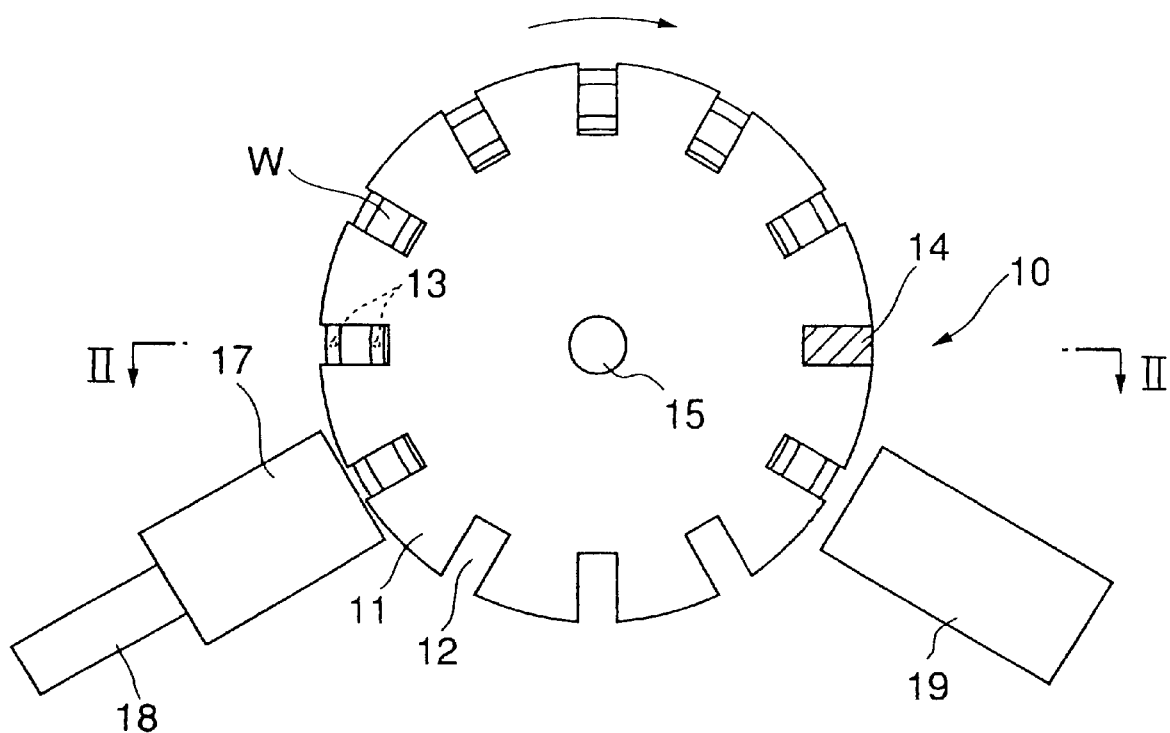
F I G. 1
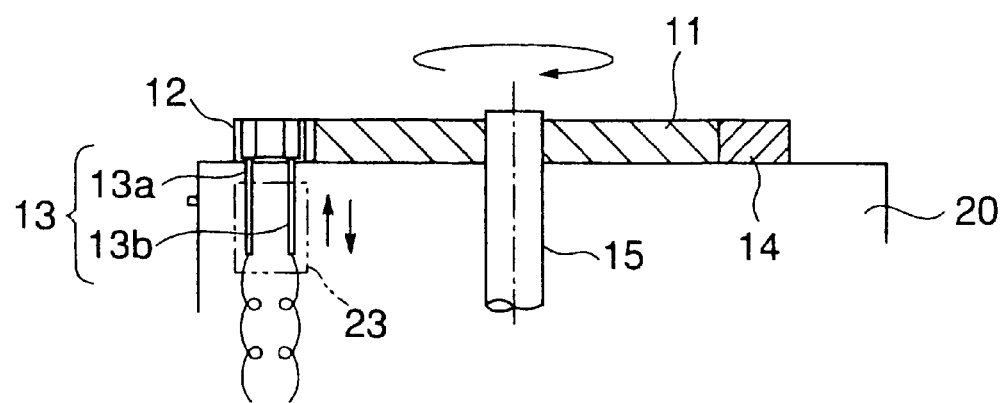
F I G. 2

WORK INSPECTION APPARATUS

This nonprovisional application claims priority under 35 U.S.C. §119(a) on Patent Application No. 2000-220997 filed in Japan on Jul. 21, 2000 which is herein incorporated by reference.

FIELD OF THE INVENTION

The present invention relates to a work inspection apparatus that is used for inspecting electrical characteristics of works, such as resistors, capacitors and other chip type electronic parts in their manufacturing process and more particularly to a work inspection apparatus capable of accurately inspecting works.

DESCRIPTION OF PRIOR ART

A work inspection apparatus equipped with a disc type turntable that has work holding pockets at the periphery and a measuring electrode that is brought in contact with a work held in the work holder of the turntable and performs prescribed electrical inspection has been so far known.

The measuring electrode is brought in contact with works held in the work holding pockets of the turntable and inspects electrical characteristics of works retained in the work holding pockets are inspected.

Generally, the surfaces of works are subject to surface treatment such as soldering, etc. When electric characteristic of works are inspected by making the measuring electrode brought in contact with the works, oxidized non-conductors such as solder on the work surface may adhere to the measuring electrode. Such oxidized non-conductors adhered on the measuring electrode are accumulated gradually with the increase of the number of inspections. As a result, there is caused such a problem that contact resistance of the measuring electrode increase and therefore the inspection accuracy deteriorate.

DISCLOSURE OF THE INVENTION

The present invention has been made in view of the points described above and it is an object of the present invention to provide a work inspection apparatus that is capable of maintaining the inspection accuracy by reducing contact resistance of a measuring electrode.

The work inspection apparatus is composed of a base, a turntable with plural work holding pockets spaced on a periphery thereof for holding works, and a measuring electrode that is brought in contact with works and performs the prescribed electric characteristic inspection of the works. The work holding pockets are open outward and works are carried in and out through these openings, and a polishing member is mounted in at least one work holding groove of the turntable for polishing the measuring electrode.

According to the present invention, works are carried in the work holding pockets that are opened outward. The turntable is rotated, the measuring electrode is brought in contact with the works in the work holding pockets and a prescribed inspection is performed. After completing the electric characteristic inspection of a prescribed number of works, the measuring electrode is brought in contact with the polishing member and the surfaces of the measuring electrode are polished.

BRIEF DESCRIPTION OF THE DRAWINGS

FIG. 1 is a plan view showing a preferred embodiment of the work inspection apparatus of the present invention.

FIG. 2 is a cross-sectional view taken along the line II—II in FIG. 1.

DETAILED DESCRIPTION OF PREFERRED EMBODIMENT

A preferred embodiment of the present invention will be described below referring to the attached drawings. FIG. 1 and FIG. 2 show a preferred embodiment of the work inspection apparatus of the present invention.

As shown in FIG. 1 and FIG. 2, a work inspection apparatus 10 is equipped with a base 20 and a turntable 11 provided on the base 20 which can rotate in a horizontal direction around a rotary shaft 15. On the periphery of the turntable 11, plural work holding pockets are formed at a prescribed space for retaining works W.

Further, a straight line feeder 18 is connected to the turntable 11 via a work separator 17 for feeding works W and further, a work ejector 19 is connected to a side opposite to the work separator 17 for ejecting works W.

Each of the work holding pockets 12 of the turntable 11 opens outward, holds works W fed from the work separator 17 and ejects the works W to the work ejector 19.

Further, the base 20 is provided with a measuring electrode 13 which is brought in contact with works W in the work holding pockets of the turntable 11 and performs the prescribed electric character inspection of works W. This measuring electrode 13 comprises a pair of electrodes 13a, 13b movable upward and downward. The pair of electrodes 13a, 13b are moved upward/downward by a lifting mechanism 23. Further, a polishing member 14 is mounted in each of the work holding pockets of the turntable 11.

Next, operation of the work inspection apparatus in the above structure in this embodiment will be described.

First, works W successively fed by the straight line feeder 18 are separated to individual one and retained in the work holding pockets 12 of the turntable 11.

When works W are retained in the work holding pockets 12, the turntable 11 horizontally arranged on the base 20 is rotated by one pitch between the adjacent work holding pockets 12. When a work W in the work retaining comes to the measuring electrode 13, the turntable 11 stops to rotate, the pair of electrodes 13a, 13b are moved upward by the lifting mechanism 23 to be in contact with the work W and a prescribed electric characteristic of the work W is inspected. Thereafter, the pair of electrodes 13a, 13b are moved downward by the lifting mechanism 23 and the turntable 11 is rotated.

The work W of which electric characteristic is thus inspected, is transferred with the rotation of the turntable 11 and ejected to the outward from the work ejector 19.

The surfaces of works W are subject to surface treatment such as soldering, etc. When the works W are successively inspected by the measuring electrode 13, oxidized nonconductors such as solder, etc. may adhere to the surfaces of the pair of electrodes 13a, 13b.

Therefore, after inspecting a prescribed number of works W by the measuring electrode 13, the pair of electrodes 13a, 13b of the measuring electrode 13 are polished by the polishing member 14.

In other words, normally when the polishing member 14 is moved close to the pair of electrodes 13a, 13b, the pair of electrodes 13a, 13b do not move upward nor contact the polishing member 14. Thereafter, when completing the inspection of a prescribed number of works W, the polishing member 14 moves to above the pair of electrodes 13a, 13b, the turntable 11 stops to rotate and at the same time, the pair of electrodes 13a, 13b move upward and contacts the polishing member 14. Then, the turntable 11 turns slightly, the surface of the pair of electrodes 13a, 13b are polished by the polishing member 14 and solder and other oxidized non-conductors on the surfaces of the pair of electrode 13a, 13b are removed.

As described above, according to this embodiment, after completing the inspection of a prescribed number of works W, the surface of the pair of electrodes 13a, 13b are polished by the polishing member 14. As a results, contact resistance of the pair of electrodes 13a, 13b can be prevented. Thus, it is also possible to maintain and improve the inspection accuracy.

As described above, according to the present invention, the measuring electrode is brought in contact with works and the electric characters of a prescribed number of works are inspected. Thereafter, the measuring electrode member is brought in contact with a polishing and the surface of the measuring electrode is polished. As a result, it is possible to maintain and improve the inspection accuracy without increasing contact resistance of the measuring electrode.

What is claimed is:

1. A work inspection apparatus comprising:

a base;

a rotating turntable with plural work holding pockets spaced on a periphery thereof, arranged horizontally on the base; and;

a measuring electrode that is provided on the base and brought in contact with works in the work holding grooves of the turntable, and performs a prescribed electric characteristic inspection of the works, wherein the work holding pockets of the turntable have openings and the works are carried in and out through these openings, and a polishing member is mounted in at least one work holding pocket of the turntable for polishing the measuring electrode, the measuring electrode being moved upward to contact the polishing member by a lifting mechanism provided on the base.

2. The work inspection apparatus according to claim 1, wherein the measuring electrode comprises a pair of electrodes.

3. The work inspection apparatus according to claim 2, wherein the pair of electrodes are brought in contact with lower parts of the works in the work holding pockets.

* * * * *